(12) United States Patent
Someya et al.

(10) Patent No.: US 9,384,977 B2
(45) Date of Patent: Jul. 5, 2016

(54) METHOD OF MANUFACTURING SEMICONDUCTOR DEVICE USING ORGANIC UNDERLAYER FILM FORMING COMPOSITION FOR SOLVENT DEVELOPMENT LITHOGRAPHY PROCESS

(71) Applicant: NISSAN CHEMICAL INDUSTRIES, LTD., Tokyo (JP)

(72) Inventors: Yasunobu Someya, Toyama (JP); Satoshi Takeda, Toyama (JP); Keisuke Hashimoto, Toyama (JP); Tetsuya Shinjo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/408,310

(22) PCT Filed: Jun. 21, 2013

(86) PCT No.: PCT/JP2013/067087
§ 371 (c)(1),
(2) Date: Dec. 16, 2014

(87) PCT Pub. No.: WO2014/007079
PCT Pub. Date: Jan. 9, 2014

(65) Prior Publication Data
US 2015/0194312 A1    Jul. 9, 2015

(30) Foreign Application Priority Data

Jul. 2, 2012   (JP) .................... 2012-148877

(51) Int. Cl.
| G03F 7/11 | (2006.01) |
|---|---|
| H01L 21/033 | (2006.01) |
| G03F 7/20 | (2006.01) |
| G03F 7/26 | (2006.01) |
| G03F 7/32 | (2006.01) |
| G06F 7/40 | (2006.01) |
| G03F 7/09 | (2006.01) |
| H01L 21/027 | (2006.01) |
| H01L 21/311 | (2006.01) |

(52) U.S. Cl.
CPC ............ *H01L 21/0337* (2013.01); *G03F 7/094* (2013.01); *G03F 7/11* (2013.01); *G03F 7/20* (2013.01); *G03F 7/26* (2013.01); *G03F 7/32* (2013.01); *G06F 7/40* (2013.01); *H01L 21/0274* (2013.01); *H01L 21/0276* (2013.01); *H01L 21/0277* (2013.01); *H01L 21/0332* (2013.01); *H01L 21/31111* (2013.01); *H01L 21/31133* (2013.01); *H01L 21/31144* (2013.01)

(58) Field of Classification Search
CPC .......... G03F 7/094; G03F 7/112; G03F 7/26; G03F 7/32; G03F 7/40; H01L 21/0274; H01L 21/0276; H01L 21/0277; H01L 21/0332; H01L 21/0337
USPC .............. 430/311, 271.1, 313, 314, 317, 322, 430/325, 329, 330, 331, 942; 438/703, 725, 438/736, 706, 737
See application file for complete search history.

(56) References Cited

U.S. PATENT DOCUMENTS

| 7,226,721 B2 * | 6/2007 | Takei .................... G03F 7/091 431/271.1 |
|---|---|---|
| 7,416,833 B2 * | 8/2008 | Hatakeyama ........... G03F 7/091 430/270.1 |
| 8,227,172 B2 * | 7/2012 | Horiguchi ................ G03F 7/09 430/270.1 |
| 8,663,898 B2 * | 3/2014 | Ogihara .................. G03F 7/094 430/270.1 |
| 8,859,191 B2 * | 10/2014 | Matsumura ............... B44C 1/22 430/323 |
| 2008/0032508 A1 * | 2/2008 | Chang .................. G03F 7/0035 438/725 |
| 2008/0261150 A1 * | 10/2008 | Tsubaki ................ G03F 7/0035 430/270.1 |
| 2009/0130594 A1 * | 5/2009 | Takei .................... G03F 7/091 430/271.1 |
| 2012/0285929 A1 * | 11/2012 | Matsumura ............... B44C 1/22 216/49 |
| 2013/0189850 A1 * | 7/2013 | Takei .................... G03F 7/091 438/759 |

FOREIGN PATENT DOCUMENTS

| JP | 2007140461 A | 6/2007 |
|---|---|---|
| JP | 2012078797 A | 4/2012 |
| JP | 2012118300 A | 6/2012 |
| WO | 2008069047 A1 | 6/2008 |
| WO | 2012039337 A1 | 3/2012 |

OTHER PUBLICATIONS

Sep. 3, 2013 Written Opinion issued in International Application No. PCT/JP2013/067087.
Sep. 3, 2013 Search Report issued in International Application No. PCT/JP2013/067087.

* cited by examiner

*Primary Examiner* — Amanda C Walke
(74) *Attorney, Agent, or Firm* — Oliff PLC

(57) ABSTRACT

A method of manufacturing a semiconductor device by use of an underlayer film material can form a good pattern without deteriorating the resolution limit. A method of manufacturing a semiconductor device, including: forming an organic underlayer film on a semiconductor substrate; forming an inorganic hard mask on organic underlayer film; forming a resist film on inorganic hard mask; performing irradiation of light or electron beam and solvent development to form a resist pattern; etching inorganic hard mask using resist pattern; etching organic underlayer film using patterned inorganic hard mask; and processing semiconductor substrate using patterned organic underlayer film, wherein the organic underlayer film is an organic underlayer film obtained by applying and heating an organic underlayer film forming composition containing a compound including an organic group having a functional group selected from group consisting of epoxy group, isocyanate group, blocked isocyanate group, and benzocyclobutene ring group, and an organic solvent.

12 Claims, No Drawings

METHOD OF MANUFACTURING SEMICONDUCTOR DEVICE USING ORGANIC UNDERLAYER FILM FORMING COMPOSITION FOR SOLVENT DEVELOPMENT LITHOGRAPHY PROCESS

TECHNICAL FIELD

The present invention relates to an organic underlayer film forming composition for use in a solvent development lithography process in manufacturing of a semiconductor device and a method of manufacturing a semiconductor device using the composition.

BACKGROUND ART

Fine processing by lithography using photoresist compositions has conventionally been performed in manufacturing of semiconductor devices. The fine processing is a processing method of forming a thin film of a photoresist composition on a substrate being processed such as a silicon wafer, irradiating the resultant thin film with an active ray such as an ultraviolet ray through a mask pattern in which a pattern of a semiconductor device is depicted for development, and etching the substrate being processed such as a silicon wafer with the resultant photoresist pattern as a protection film. With the high integration of semiconductor devices in recent years, the active ray used tend to have shorter wavelengths, for example, from KrF excimer laser light (248 nm) to ArF excimer laser light (193 nm). Accordingly, the influence of diffuse reflection of the active ray on the substrate or standing waves has become a serious problem. The use of an anti-reflective coating (Bottom Anti-Reflective Coating, BARC) between the photoresist and the substrate being processed, therefore, has been widely studied.

In the future, with further refinement of resist patterns, a problem of resolution or collapse of resist patterns after development should arise to cause a demand for reducing the film thickness of resists. It is therefore difficult to obtain a resist pattern film thickness sufficient for processing the substrate, and there arises a need for a process that allows not only the resist pattern but also the resist underlayer film formed between the resist and the semiconductor substrate being processed to function as a mask during the substrate processing. There is a growing demand, as a resist underlayer film for such a process, unlike conventional high etch-rate (high etching rate) resist underlayer films, for a resist underlayer film for lithography having a dry etching rate selectivity close to that of the resist, a resist underlayer film for lithography having a dry etching rate selectivity smaller than that of the resist, or a resist underlayer film for lithography having a dry etching rate selectivity smaller than that of the semiconductor substrate (see Patent Document 1).

PRIOR ART DOCUMENT

Patent Document

Patent Document 1: International Application Publication No, WO 2008/069047 pamphlet

SUMMARY OF THE INVENTION

Problem to be Solved by the Invention

An object of the present invention is to provide an organic underlayer film forming composition for use in a lithography process in manufacturing of a semiconductor device. Another object of the present invention is to provide an organic underlayer film for lithography having a dry etching rate selectivity close to that of the resist, an organic underlayer film for lithography having a dry etching rate selectivity smaller than that of the resist, and an organic underlayer film for lithography having a dry etching rate selectivity smaller than that of the semiconductor substrate, for yielding an excellent resist pattern without causing intermixing with an inorganic hard mask layer.

The organic underlayer film includes an underlayer film for a solvent development-type resist capable of forming a good resist pattern when a resist that is developed with a solvent is used. The performance of effectively absorbing light reflected on the substrate when irradiated light having a wavelength of, for example, 248 nm, 193 nm, or 157 nm is used in the fine processing may be imparted to the composition of the present invention. A further object of the present invention is to provide a method of forming a resist pattern using an organic underlayer film forming composition and a method of manufacturing a semiconductor device using this method.

Means for Solving the Problem

The present invention provides:

according to a first aspect, a method of manufacturing a semiconductor device, characterized by comprising: forming an organic underlayer film on a semiconductor substrate; forming an inorganic hard mask on the organic underlayer film; forming a resist film on the inorganic hard mask; performing irradiation of light or an electron beam and solvent development to form a resist pattern; etching the inorganic hard mask using the resist pattern; etching the organic underlayer film using the patterned inorganic hard mask; and processing the semiconductor substrate using the patterned organic underlayer film, in which the organic underlayer film is an organic underlayer film obtained by applying and heating an organic underlayer film forming composition containing a compound including an organic group having a functional group selected from the group consisting of an epoxy group, an isocyanate group, a blocked isocyanate group, and a benzocyclobutene ring group, and an organic solvent;

according to a second aspect, the method of manufacturing a semiconductor device according to the first aspect, in which the compound in the organic underlayer film forming composition is a polymer including a unit structure including an organic group (A1) having a functional group selected from the group consisting of an epoxy group, an isocyanate group, and a blocked isocyanate group, and a unit structure including an organic group (B1) having a functional group selected from the group consisting of a hydroxy group, a carboxylic acid group, a blocked carboxylic acid group, an amino group, an amido group, an isocyanuric acid group, and a thiol group;

according to a third aspect, the method of manufacturing a semiconductor device according to the first aspect, in which the compound in the organic underlayer film forming composition is a mixture comprising a polymer including a unit structure including an organic group (A1) having a functional group selected from the group consisting of an epoxy group, an isocyanate group, and a blocked isocyanate group, and a cross-linking compound including an organic group (B1) having a functional group selected from the group consisting of a hydroxy group, a carboxylic acid group, a blocked carboxylic acid group, an amino group, an amido group, an isocyanuric acid group, and a thiol group;

according to a fourth aspect, the method of manufacturing a semiconductor device according to the first aspect, in which the compound in the organic underlayer film forming composition is a mixture comprising a cross-linking compound including an organic group (A1) having a functional group selected from the group consisting of an epoxy group, an isocyanate group, and a blocked isocyanate group, and a polymer including a unit structure including an organic group (B1) having a functional group selected from the group consisting of a hydroxy group, a carboxylic acid group, a blocked carboxylic acid group, an amino group, an amido group, an isocyanuric acid group, and a thiol group;

according to a fifth aspect, the method of manufacturing a semiconductor device according to the second aspect, in which the compound in the organic underlayer film forming composition is a polymer including a unit structure including an organic group (A2) having an epoxy group or a blocked isocyanate group and a unit structure including an organic group (B2) having a hydroxy group, a blocked carboxylic acid group, or an amino group;

according to a sixth aspect, the method of manufacturing a semiconductor device according to the fourth aspect, in which the compound in the organic underlayer film forming composition is a mixture comprising a cross-linking compound including an organic group (A3) having an epoxy group or an isocyanate group, and a polymer including a unit structure including an organic group (B3) having a hydroxy group; and according to a seventh aspect, the method of manufacturing a semiconductor device according to any one of the second to sixth aspects, in which the organic group (B1), (B2), or (B3) is blended in an amount of 0.05 mol to 2 mol with respect to 1 mol of the organic group (A1), (A2), or (A3).

Effects of the Invention

The organic underlayer film forming composition of the present invention can be used to form a good resist pattern shape without causing intermixing with the inorganic hard mask layer.

The performance of efficiently suppressing reflection from the substrate may be imparted to the organic underlayer film forming composition of the present invention, so that the organic underlayer film forming composition can additionally have the effect as an anti-reflective coating against exposure light, The organic underlayer film forming composition of the present invention can provide an excellent organic underlayer film having a dry etching rate selectivity close to that of the resist, a dry etching rate selectivity smaller than that of the resist, or a dry etching rate selectivity smaller than that of the semiconductor substrate.

With refinement of resist patterns in recent years, the film thickness of resists has been reduced in order to prevent collapse of resist patterns after development. Those thin resists involve the process of transferring a resist pattern to the underlayer film in the etching process and processing the substrate using the underlayer film as a mask, or the process of repeating the steps of transferring a resist pattern to the underlayer film in the etching process and further transferring the pattern transferred on the underlayer film to the underlayer film using a different gas composition, and finally processing the substrate. The organic underlayer film and the composition for forming the same according to the present invention are effective in these processes and have sufficient etching resistance for the substrate being processed (for example, a thermally oxidized silicon film, a silicon nitride film, or a polysilicon film on the substrate) when the substrate is processed using the organic underlayer film of the present invention.

The organic underlayer film of the present invention can be used as a planarizing film, an anti-contamination film for the resist layer, and a film having dry etch selectivity. Accordingly, the resist pattern formation in a lithography process in manufacturing of a semiconductor device can be performed easily and accurately.

There is a process including: forming an organic underlayer film on a substrate with the organic underlayer film forming composition of the present invention; forming an inorganic hard mask layer on the organic underlayer film; forming a resist film on the inorganic hard mask layer; performing exposure and solvent development thereby forming a resist pattern; transferring the resist pattern onto the inorganic hard mask layer; transferring the resist pattern transferred on the inorganic hard mask layer to the organic underlayer film; and processing the semiconductor substrate using the organic underlayer film. In this process, the inorganic hard mask layer is formed with a coating-type composition including an organic polymer or an inorganic polymer and a solvent or by vacuum evaporation of an inorganic substance. In the vacuum evaporation of an inorganic substance (for example, silicon oxynitride), the evaporated substance is deposited on the surface of the organic underlayer film. In doing so, the temperature of the surface of the organic underlayer film may increase to about 400° C.

With the organic underlayer film obtained from the organic underlayer film forming composition of the present invention, the resist pattern transferred on the overlying inorganic hard mask layer can be transferred to the organic underlayer film by dry etching. With the resist pattern transferred on the organic underlayer film, the semiconductor substrate can be further processed by dry etching.

MODES FOR CARRYING OUT THE INVENTION

The present invention provides a method of manufacturing a semiconductor device, characterized by comprising: forming an organic underlayer film on a semiconductor substrate; forming an inorganic hard mask on the organic underlayer film; forming a resist film on the inorganic hard mask; performing irradiation of light or an electron beam and solvent development thereby forming a resist pattern; etching the inorganic hard mask using the resist pattern; etching the organic underlayer film using the patterned inorganic hard mask; and processing the semiconductor substrate using the patterned organic underlayer film, in which the organic underlayer film is an organic underlayer film obtained by applying and heating an organic underlayer film forming composition containing a compound including an organic group having a functional group selected from the group consisting of an epoxy group, an isocyanate group, a blocked isocyanate group, and a benzocyclobutene ring group, and an organic solvent.

The organic underlayer film forming composition that forms the organic underlayer film includes the compound as described above and an organic solvent and, if necessary, includes an additive such as a surfactant. The total solid content of the composition excluding the solvent is 0.1% by mass to 70% by mass and preferably 1% by mass to 60% by mass. The compound is contained in an amount of 1% by mass to 100% by mass, 1% by mass to 99.9% by mass, 1% by mass to 99% by mass, or 1% by mass to 98% by mass in the total solid content.

The compound in the organic underlayer film forming composition may be a polymer including a unit structure including an organic group (A1) having a functional group selected from the group consisting of an epoxy group, an isocyanate group, and a blocked isocyanate group, and a unit structure including an organic group (B1) having a functional group selected from the group consisting of a hydroxy group, a carboxylic acid group, a blocked carboxylic acid group, an amino group, an amido group, an isocyanuric acid group, and a thiol group.

The compound in the organic underlayer film forming composition may be a mixture comprising a polymer including a unit structure including an organic group (A1) having a functional group selected from the group consisting of an epoxy group, an isocyanate group, and a blocked isocyanate group, and a cross-linking compound including an organic group (B1) having a functional group selected from the group consisting of a hydroxy group, a carboxylic acid group, a blocked carboxylic acid group, an amino group, an amido group, an isocyanuric acid group, and a thiol group.

The compound in the organic underlayer film forming composition may be a mixture comprising a cross-linking compound including an organic group (A1) having a functional group selected from the group consisting of an epoxy group, an isocyanate group, and a blocked isocyanate group, and a polymer including a unit structure including an organic group (B1) having a functional group selected from the group consisting of a hydroxy group, a carboxylic acid group, a blocked carboxylic acid group, an amino group, an amido group, an isocyanuric acid group, and a thiol group.

Among those, as the compound in the organic underlayer film forming composition, a polymer including a unit structure including an organic group (A2) having an epoxy group or a blocked isocyanate group and a unit structure including an organic group (B2) having a hydroxy group, a blocked carboxylic acid group, or an amino group may preferably be used.

As the compound in the organic underlayer film forming composition, a mixture comprising a cross-linking compound including an organic group (A3) having an epoxy group or an isocyanate group, and a polymer including a unit structure including an organic group (B3) having a hydroxy group may preferably be used.

The weight average molecular weight of the polymer used in the present invention is, for example, 1000 to 200,000 and preferably 1000 to 20,000. If the weight average molecular weight of the polymer is less than 1000, the solvent resistance may be insufficient. The weight average molecular weight is obtained by gel permeation chromatography (GPC) using polystyrene as a standard sample.

In the present invention, the organic group (B1), (B2), or (B3) may be blended in an amount of 0.05 mol to 2 mol with respect to 1 mol of the organic group (A1), (A2), or (A3). Preferably, the organic group (B1), (B2), or (133) may be contained in an amount of 1 mol with respect to 1 mol of the organic group (A1), (A2), or (A3).

Examples of the polymer may be as follows:

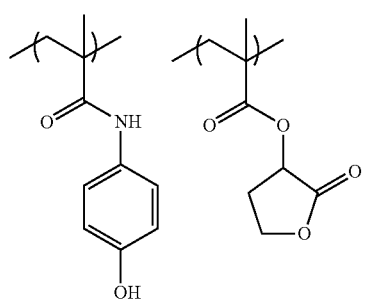

Formula (1-1)

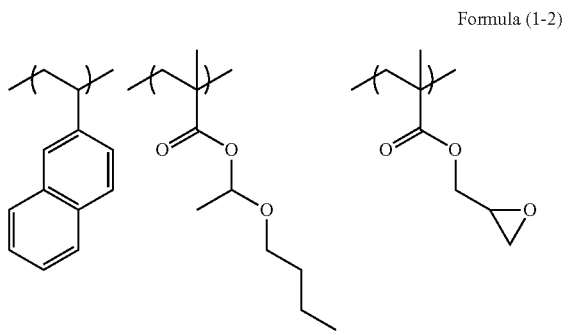

Formula (1-2)

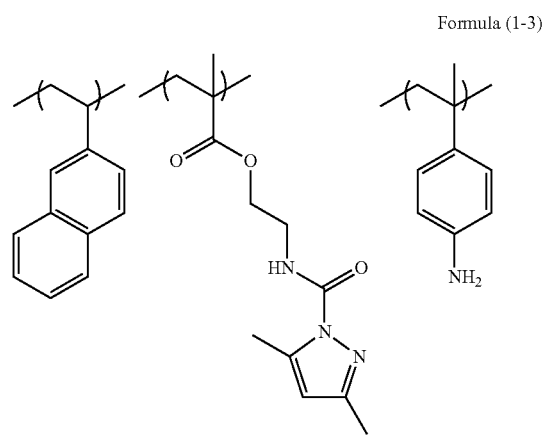

Formula (1-3)

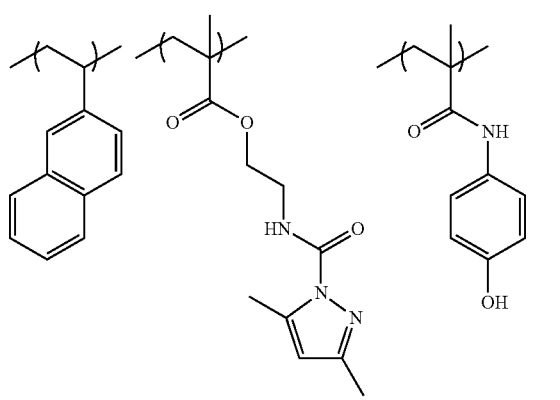

(Formula 1-4)

Formula (1-5)

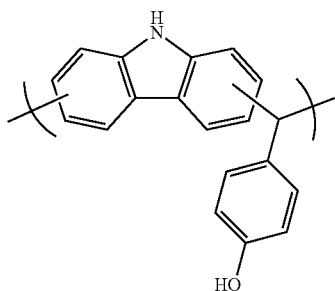

Among the cross-linking compounds used in the present invention, the cross-linking compound having an epoxy group is, specifically, for example, YH434L (trade name, manufactured by Tohto Kasei Co., Ltd.). This is a tetrafunctional polyglycidylamine having an epoxy equivalent of 110 to 130 (g/eq), with the physical property of, for example, a viscosity of 5000 to 10,000 (mPa·s) measured at 50° C.

Specific examples of the cross-linking compound having a blocked isocyanate group include TAKENATE [trade name] B-830, TAKENATE B-870N (manufactured by Mitsui Chemicals, Inc.), and VESTANAT [trade name] B1358/100 (manufactured by Evonik Degussa Japan Co., Ltd.).

TAKENATE (trade name) B-830 is a blocked tolylene diisocyanate.

TAKENATE (trade name) B-870N is a methyl ethyl ketone oxime-blocked isophorone diisocyanate.

VESTANAT [trade name] B1358/100 is a blocked polyisocyanate based on isophorone diisocyanate.

Here, the blocked isocyanate group refers to an isocyanate group (—N=C=O) blocked by an appropriate protecting group. Examples of the blocking agent include alcohols such as methanol, ethanol, isopropanol, n-butanol, 2-ethoxyhexanol, 2-N,N-dimethylaminoethanol, 2-ethoxyethanol, and cyclohexanol; phenols such as phenol, o-nitrophenol, p-chlorophenol, o-cresol, m-cresol, and p-cresol; lactams such as c-caprolactam; oximes such as acetone oxime, methyl ethyl ketone oxime, methyl isobutyl ketone oxime, cyclohexanone oxime, acetophenone oxime, and benzophenone oxime; pyrazoles such as pyrazole, 3,5-dimethylpyrazole, and 3-methylpyrazole; and thiols such as dodecanethiol and benzenethiol.

The blocked carboxylic acid group refers to a carboxylic acid group (COO—) blocked by a protecting group such as vinyl ethers. Examples of the blocking agent include alkyl vinyl ethers such as n-propylvinyl ether.

In synthesizing the polymer, another addition-polymerizing monomer can be used in combination. Examples of the addition-polymerizing monomer include acrylic ester compounds, methacrylic ester compounds, acrylamide compounds, methacrylamide compounds, vinyl compounds, styrene-based compounds, maleimide compounds, maleic anhydride, and acrylonitrile.

Examples of the acrylic ester compounds include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate, and 5-acryloyloxy-6-hydroxynorbornene-2-carboxylic-6-lactone.

Examples of the methacrylic ester compounds include ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, n-lauryl methacrylate, n-stearyl methacrylate, methoxydiethylene glycol methacrylate, methoxypolyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone, and 2,2,3,3,4,4,4-heptafluorobutyl methacrylate.

Examples of the acrylamide compounds include acrylamide, N-methyl acrylamide, N-ethyl acrylamide, N-benzyl acrylamide, N-phenyl acrylamide, and N,N-dimethyl acrylamide.

Examples of the methacrylic acid amide compounds include methacrylamide, N-methyl methacrylamide, N-ethyl methacrylamide, N-benzyl methacrylamide, N-phenyl methacrylamide, and N,N-dimethyl methacrylamide.

Examples of the vinyl compounds include vinyl ether, methyl vinyl ether, benzyl vinyl ether, 2-hydroxyethyl vinyl ether, phenyl vinyl ether, and propyl vinyl ether.

Examples of the styrene-based compounds include styrene, methyistyrene, chlorostyrene, bromostyrene, hydroxystyrene, and vinylnaphthalene.

Examples of the maleimide compounds include maleimide, N-methylmaleimide, N-phenylmaleimide, and N-cyclohexylmaleimide.

The polymer can be produced by dissolving the addition-polymerizing monomer and a chain transfer agent (not more than 10% with respect to the mass of the monomer), added if necessary, in an organic solvent, then adding a polymerization initiator to cause a polymerization reaction, and then adding a polymerization terminator. The amount of the polymerization initiator added is 1% to 10% with respect to the mass of the monomer and the amount of the polymerization terminator added is 0.01% to 0.2%. Examples of the organic solvent used include propylene glycol monomethyl ether, propylene glycol monopropyl ether, ethyl lactate, cyclohexanone, methyl ethyl ketone, and dimethyl formamide. Examples of the chain transfer agent include dodecane thiol and dodecyl thiol. Examples of the polymerization initiator include azobisisobutylonitrile and azobiscyclohexanecarbonitrile. Examples of the polymerization terminator include 4-methoxyphenol. The reaction temperature is appropriately selected from 30° C. to 100° C. The reaction time is appropriately selected from 1 hour to 48 hours.

An additional light absorbing agent, a rheology controlling agent, an adhesion assistant, a surfactant, or other substances may be added, if necessary, besides the substances described above to the organic underlayer film forming composition used in the present invention.

Examples of the additional light absorbing agent include commercially available light absorbing agents described in "Kogyoyo shikiso no gijyutu to shijyo (technology and market of industrial dyes)" (CMC Publishing Co., Ltd.) and "Senryo Binran (handbook for dyes)" (edited by The Society of Synthetic Organic Chemistry, Japan). Preferred examples include C.I. Disperse Yellow 1, 3, 4, 5, 7, 8, 13, 23, 31, 49, 50, 51, 54, 60, 64, 66, 68, 79, 82, 88, 90, 93, 102, 114, and 124; C.I. Disperse Orange 1, 5, 13, 25, 29, 30, 31, 44, 57, 72, and 73; C.I. Disperse Red 1, 5, 7, 13, 17, 19, 43, 50, 54, 58, 65, 72, 73, 88, 117, 137, 143, 199, and 210; C.I. Disperse Violet 43; CA. Disperse Blue 96; C.I. Fluorescent Brightening Agent 112, 135, and 163; C.I. Solvent Orange 2 and 45; C.I. Solvent Red 1, 3, 8, 23, 24, 25, 27, and 49; C.I. Pigment Green 10; and C.I. Pigment Brown 2. The light absorbing agent is blended generally in an amount of not more than 10% by mass and preferably not more than 5% by mass, with respect to the total solid content of the organic underlayer film forming composition.

The rheology controlling agent is added mainly for the purpose of enhancing the fluidity of the organic underlayer film forming composition, particularly for enhancing the uniformity of film thickness of the organic underlayer film or enhancing the hole-filling property of the organic underlayer film forming composition during the baking process. Specific examples may include phthalic acid derivatives such as dimethyl phthalate, diethyl phthalate, diisobutyl phthalate, dihexyl phthalate, and butylisodecyl phthalate; adipic acid derivatives such as di-n-butyl adipate, diisobutyl adipate, diisooctyl adipate, and octyldecyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate. These rheology controlling agents are blended generally in an amount of less than 30% by mass with respect to the total solid content of the organic underlayer film forming composition.

The adhesion assistant is added mainly for the purpose of enhancing the adhesion of the organic underlayer film forming composition with the substrate or the resist or the inorganic hard mask, particularly for preventing separation of the resist in development. Specific examples may include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyl dimethoxysilane, dimethylvinylethoxysilane, diphenyldimethoxysilane, and phenyltriethoxysilane; silazanes such as hexamethyldisilazane, N,N'-bis(trimethylsilyl) urea, dimethyltrimethylsilylamine, and trimethylsilylimidazol; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzooxazole, urazole, thiouracil, mercaptoimidazole, and mercaptopyrimidine; ureas such as 1,1-dimethyl urea and 1,3-dimethyl urea; and thiourea compounds. These adhesion assistants are blended in an amount of generally less than 5% by mass and preferably less than 2% by mass with respect to the total solid content of the organic underlayer film forming composition for lithography.

In the organic underlayer film forming composition of the present invention, a surfactant may be blended for the purpose of preventing pinholes and striations and further enhancing the coating property against surface defects. Examples of the surfactant may include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants, for example, EFTOP EF301, EF303, and EF352 (trade name, manufactured by Tohkem Products Corporation), MEGAFAC F171, F173, and R-30 (trade name, manufactured by Dainippon Ink and Chemicals), Fluorad FC430 and FC431 (trade name; manufactured by Sumitomo 3M Limited), Asahi Guard AG710 and Surfron S-382, SC101, SC102, SC103, SC104, SC105, and SC106 (trade name, manufactured by Asahi Glass Co., Ltd.); and Organosiloxane polymer KP341 (manufactured by Shin-Etsu Chemical Co., Ltd.). These surfactants are blended generally in an amount of not more than 2.0% by mass and preferably, not more than 1.0% by mass with respect to the total solid content of the organic underlayer film forming composition used in the present invention. These surfactants may be used alone or in combination of two or more of them.

In the present invention, examples of the solvent that can be used for dissolving the compound described above include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used alone or in combination of two or more of them.

A high-boiling point solvent such as propylene glycol monobutyl ether and propylene glycol monobutyl ether acetate can be further mixed. Among these solvents, propylene glycol monomethyl ether, propylene glycol monomethyl ether acetate, ethyl lactate, butyl lactate, cyclohexanone, and the like are preferred in terms of enhancing the leveling property.

Next, a method of forming a resist pattern according to the present invention is described. The organic underlayer film forming composition is applied on a substrate for use in manufacturing of a precision integrated circuit device (for example, a transparent substrate such as a silicon/silicon dioxide coat, a glass substrate, and an ITO substrate) by an appropriate coating method such as a spinner or a coater, and then baked and cured to produce a coating-type organic underlayer film. Here, the film thickness of the organic underlayer film layer is preferably 0.01 µm to 3.0 µm. After the coating is applied, the organic underlayer film forming composition is baked under the conditions of 80° C. to 450° C. for 0.5 to 120 minutes, Subsequently, a resist is applied directly on the organic underlayer film forming composition or on a coating material (for example, an inorganic hard mask) of a single layer or several layers deposited on the organic underlayer film, if necessary, and developed by irradiation of light or an electron beam through a predetermined mask, and then rinsed and dried, resulting in a good resist pattern. Heating (PEB: Post Exposure Bake) may be performed, if necessary, after irradiation of light or an electron beam. The part of the organic underlayer film in which the resist is developed and removed in the preceding step is removed by dry etching to form a predetermined pattern on the substrate.

Any photoresist can be used in the present invention as long as it is photosensitive to light used for exposure. Either negative photoresists or positive photoresists can be used. Any photoresist can be used as long as it can be developed with a solvent after exposure. Examples include trade name AR27721N manufactured by JSR Corporation.

Next, exposure is performed through a predetermined mask. In exposure, a KrF excimer laser (wavelength of 248 nm), an ArF excimer laser (wavelength of 193 nm), an F2 excimer laser (wavelength of 157 nm), or other lasers can be used. After exposure, post exposure bake can be performed, if necessary. The post exposure bake is performed under the conditions appropriately selected from heating temperatures of 70° C. to 150° C. and heating duration of 0.3 minutes to 10 minutes.

In the present invention, a resist for electron beam lithography may be used as a resist in place of the photoresist. Either positive or negative electron beam resists can be used. Any photoresist can be used as long as it can be developed with a solvent after exposure. A resist pattern can be formed using such an electron beam resist in the same manner as when the photoresist is used with electron beams as a irradiation source.

The exposure light used for the photoresist is chemical rays such as near ultraviolet rays, far ultraviolet rays, or extreme ultraviolet (for example, EUV) rays. For example, light having a wavelength of 248 nm (KrF laser light), 193 nm (ArF laser light), or 157 am ($F_2$ laser light) is used. Any method can be used for light irradiation as long as an acid is generated from a photo acid generator with exposure energy of 1 $mJ/cm^2$ to 2000 $mJ/cm^2$, or 10 $mJ/cm^2$ to 1500 $mJ/cm^2$, or 50 $mJ/cm^2$ to 1000 $mJ/cm^2$.

The electron beam irradiation for the electron beam resist can be applied using, for example, an electron beam irradiator.

Next, the resist is developed using a developer (organic solvent). For example, when a positive photoresist is used, the not-exposed part of the photoresist is removed to form a pattern of the photoresist.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy butyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxy propionate, ethyl-3-methoxy propionate, ethyl-3-ethoxy propionate, and propyl-3-methoxy propionate. A surfactant or other substances can be added to these developers. The development conditions are appropriately selected from temperatures of 5° C. to 50° C. and duration of 10 seconds to 600 seconds.

In the present invention, a semiconductor device can be manufactured through the steps of: forming the organic underlayer film layer on a semiconductor substrate with the organic underlayer film forming composition; forming a resist film on the organic underlayer film layer; forming a resist pattern through light or electron beam irradiation and development; etching the organic underlayer film layer using the resist pattern; and processing the semiconductor substrate using the patterned organic underlayer film layer.

In the future, with further refinement of resist patterns, a problem of resolution or collapse of resist patterns after development should arise to cause a demand for reducing the film thickness of resists. It is therefore difficult to obtain a resist pattern film thickness sufficient for processing the substrate, and there arises a need for a process that allows not only the resist pattern but also the organic underlayer film layer formed between the resist and the semiconductor substrate being processed to function as a mask during substrate processing. There is a growing demand, as such a process organic underlayer film layer, unlike conventional high etch-rate organic underlayer films, for an organic underlayer film for lithography having a dry etching rate selectivity close to that of the resist, an organic underlayer film for lithography having a dry etching rate selectivity smaller than that of the resist, or an organic underlayer film layer having a dry etching rate selectivity smaller than that of the semiconductor substrate. Anti-reflective ability may be imparted to such organic underlayer film layers, so that the organic underlayer film layers can additionally have the function of conventional anti-reflective coatings.

Meanwhile, in order to obtain a fine resist pattern, a process of making a thinner resist pattern and organic underlayer film layer during dry etching of the organic underlayer film layer than the pattern width during resist development has come to be used. There is a growing demand for an organic underlayer film layer having a dry etching rate selectivity close to that of the resist, as such a process organic underlayer film layer, unlike conventional high-etch rate anti-reflective coatings. Anti-reflective ability may be imparted to such organic underlayer film layers, so that the organic underlayer film layers can additionally have the function of conventional anti-reflective coatings.

In the present invention, after the organic underlayer film layer of the present invention is deposited on a substrate, a resist can be applied directly on the organic underlayer film layer or on a coating material of a single layer or several layers deposited on the organic underlayer film layer, if necessary.

The resulting pattern width of the resist is reduced, and even when the resist is applied thinly for the purpose of preventing pattern collapse, the substrate can be processed by selecting an appropriate etching gas.

That is, a semiconductor device can be manufactured through the steps of: forming the organic underlayer film layer on a semiconductor substrate with the organic underlayer film forming composition; forming an inorganic hard mask layer on the organic underlayer film layer with a coating material containing a silicon component or other substances; forming a resist film on the inorganic hard mask layer; forming a resist pattern through light or electron beam irradiation and development; etching the inorganic hard mask layer using the resist pattern; etching the organic underlayer film layer using the patterned inorganic hard mask layer; and processing the semiconductor substrate using the patterned organic underlayer film layer.

In light of the effect of the organic underlayer film forming composition for lithography used in the present invention as an anti-reflective coating, there is no diffusion into the photoresist during heating and drying because the light-absorbing moiety is incorporated in the skeleton, and the anti-reflective effect is high because the light-absorbing moiety has sufficiently high light-absorbing performance.

The organic underlayer film forming composition for lithography used in the present invention has high thermal stability, prevents contamination of the upper layer film by the decomposed product during baking, and provides a temperature margin in the baking process.

The organic underlayer film forming composition for lithography used in the present invention can be used as a film having the function of preventing reflection of light and the function of preventing interaction between the substrate and the photoresist or preventing adverse effects of the material used in the photoresist or the substance produced during exposure of the photoresist on the substrate, depending on the process conditions.

EXAMPLES

Synthesis Example 1

In 72 g of propylene glycol monomethyl ether, 12.0 g of 4-hydroxyphenyl methacrylamide, 4.9 g of γ-butyrolactone methacrylate, and 1.2 g of 2,2'-azobisisobutyronitrile were dissolved. This solution was added dropwise into a 300-ml flask containing 91 g of propylene glycol monomethyl ether heated to 85° C. After the dropwise addition was completed, the resultant mixture was stirred for about 15 hours. After the reaction was finished, the resultant product was added dropwise to a mixed solution of ethyl acetate and hexane to precipitate a polymer. The resultant precipitation was filtered under reduced pressure and the filtrate was washed with a mixed solution of ethyl acetate and hexane, followed by drying under reduced pressure at 50° C. overnight, resulting in 12.0 g of a polymer. The resultant polymer was equivalent to Formula (1-1) above. The weight average molecular weight Mw measured by GPC in terms of polystyrene was 10,700.

Synthesis Example 2

In 38.03 g of cyclohexanone, 8.00 g of 2-vinylnaphthalene (manufactured by Midori Kagaku Co., Ltd.), 1.05 g of glycidyl methacrylate, 1.38 g of butoxy(2-ethyl)methacrylate, and 0.6 g of 2,2'-azobisisobutyronitrile were dissolved, and the solution was thereafter heated and stirred at 85° C. for about 15 hours. The resultant polymer was equivalent to Formula (1-2) above. The weight average molecular weight Mw measured by GPC in terms of polystyrene was 6000.

Synthesis Example 3

In 45.59 g of cyclohexanone, 8.00 g of 2-vinylnaphthalene (manufactured by Midori Kagaku Co., Ltd.), 1.69 g of a blocked isocyanate based acrylic (manufactured by Showa Denko K.K., trade name: MOI-BP), 0.77 g of p-aminostyrene, and 0.62 g of 2,2'-azobisisobutyronitrile were dissolved, and the solution was thereafter heated and stirred at 85° C. for about 15 hours. The resultant polymer was equivalent to Formula (1-3) above. The weight average molecular weight Mw measured by GPC in terms of polystyrene was 5000.

Synthesis Example 4

In 57.17 g of cyclohexanone, 7.00 g of 2-vinylnaphthalene (manufactured by Midori Kagaku Co., Ltd.), 3.80 g of a blocked isocyanate based acrylic (manufactured by Showa Denko K.K., trade name: MOI-BP), 2.68 g of 4-hydroxyphenyl methacrylamide, and 0.81 g of 2,2'-azobisisobutyronitrile were dissolved, and the solution was thereafter heated and stirred at 85° C. for about 15 hours. The resultant polymer was equivalent to Formula (1-4) above. The weight average molecular weight Mw measured by GPC in terms of polystyrene was 5,300.

Synthesis Example 5

In a 100-mL flask, carbazole (8.00 g, manufactured by Tokyo Chemical Industry Co., Ltd.), 4-hydroxybenzaldehyde (5.84 g, manufactured by Tokyo Chemical Industry Co., Ltd.), and p-toluenesulfonic acid monohydrate (0.97 g, manufactured by KANTO CHEMICAL CO., INC.) were added, and toluene (10.48 g, manufactured by KANTO CHEMICAL CO., INC.) and 1,4-dioxane (24.32 g, manufactured by KANTO CHEMICAL CO., INC.) were charged. The resultant mixture was stirred and dissolved with the temperature increased to 110° C. to initiate polymerization. After 24 hours, the product was left cool to 60° C., and then the solvent was removed with an evaporator. The resultant precipitation was dissolved in propylene glycol monomethyl ether and dried with a vacuum drier at 80° C. for 12 hours, resulting in 35.98 g of a polymer of interest. The resultant polymer was equivalent to Formula (1-5) above. The weight average molecular weight Mw measured by GPC in terms of polystyrene was 11,200, and the polydispersity Mw/Mn was 3.58.

Comparative Synthesis Example 1

In a 300-mL flask, carbazole (30.00 g, manufactured by Tokyo Chemical Industry Co., Ltd.), 1-naphthaldehyde (28.07 g, manufactured by Tokyo Chemical Industry Co., Ltd.), and p-toluenesulfonic acid monohydrate (3.57 g, manufactured by KANTO CHEMICAL CO., INC.) were added, and toluene (143.77 g, manufactured by KANTO CHEMICAL CO., INC.) was charged. The resultant mixture was stirred and dissolved with the temperature increased to 110° C. to initiate polymerization. After 27 hours, the product was left cool to 60° C., and then, was reprecipitated in methanol (2000 ml, manufactured by KANTO CHEMICAL CO., INC.). The resultant precipitation was filtrated and dried with a vacuum drier at 80° C. for 12 hours, resulting in 37.89 g of a polymer of interest. The resultant polymer was equivalent to Formula (2-1) below. The weight average molecular weight Mw measured by GPC in terms of polystyrene was 3,800, and the polydispersity Mw/Mn was 1.88.

Formula (2-1)

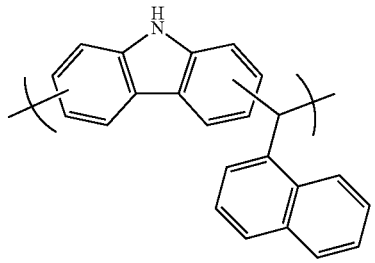

Example 1

To 2 g of the resin obtained in Synthesis Example 1, 0.36 g of an isocyanate-based cross-linking agent (manufactured by Mitsui Chemicals, Inc., trade name: TAKENATE B-830, contained in an amount of 55% by mass in a mixed solvent of ethyl acetate and methyl isobutyl ketone) and 0.01 g of a surfactant (manufactured by NEOS COMPANY LIMITED, product name: FTERGENT [trade name] 208G, composed of a fluorine-based surfactant) were added. The resultant mixture was dissolved in 23 g of propylene glycol monomethyl ether to obtain a solution. Subsequently, the solution was filtered using a polyethylene microfilter with a pore diameter of 0.2 μm to prepare a solution of the organic underlayer film forming composition for use in a lithography process with a multilayer film.

Example 2

To 2 g of the resin obtained in Synthesis Example 2, 0.01 g of a surfactant (manufactured by DIC Corporation, product name: MEGAFAC [trade name] R-30, composed of a fluorine-based surfactant) was added. The resultant mixture was dissolved in 3.5 g of propylene glycol monomethyl ether acetate, 18.4 g of cyclohexanone, and 1.2 g of γ-butyrolactone to obtain a solution. Subsequently, the solution was filtered using a polyethylene microfilter with a pore diameter of 0.2 μm to prepare a solution of the organic underlayer film forming composition for use in a lithography process with a multilayer film.

Example 3

To 2 g of the resin obtained in Synthesis Example 3, 0.01 g of a surfactant (manufactured by DIC Corporation, product name: MEGAFAC [trade name] R-30, composed of a fluorine-based surfactant) was added. The resultant mixture was dissolved in 6.9 g of propylene glycol monomethyl ether acetate and 16.1 g of cyclohexanone to obtain a solution. Subsequently, the solution was filtered using a polyethylene microfilter with a pore diameter of 0.2 μm to prepare a solution of the organic underlayer film forming composition for use in a lithography process with a multilayer film.

Example 4

To 2 g of the resin obtained in Synthesis Example 4, 0.01 g of a surfactant (manufactured by DIC Corporation, product name: MEGAFAC [trade name] R-30, composed of a fluorine-based surfactant) was added. The resultant mixture was dissolved in 6.9 g of propylene glycol monomethyl ether acetate and 16.1 g of cyclohexanone to obtain a solution. Subsequently, the solution was filtered using a polyethylene microfilter with a pore diameter of 0.2 μm to prepare a solution of the organic underlayer film forming composition for use in a lithography process with a multilayer film.

Example 5

To 1.0 g of the resin obtained in Synthesis Example 5, 0.2 g of an epoxy-based cross-linking agent (manufactured by Tohto Kasei Co., Ltd., trade name: YH434L) and 0.003 g of a surfactant (manufactured by DIC Corporation, product name: MEGAFAC [trade name] R-30, composed of a fluorine-based surfactant) were added. The resultant mixture was dissolved in 6.7 g of propylene glycol monomethyl ether and 15.6 g of propylene glycol monomethyl ether acetate to obtain a solution. Subsequently, the solution was filtered using a polyethylene microfilter with a pore diameter of 0.2 μm to prepare a solution of the organic underlayer film forming composition for use in a lithography process with a multilayer film.

Example 6

To 1.0 g of a commercially available phenol novolac resin (manufactured by Gunei Chemical Industry Co., Ltd.), 0.2 g of an epoxy-based cross-linking agent (manufactured by Tohto Kasei Co., Ltd., trade name: YH434L) and 0.003 g of a surfactant (manufactured by DIC Corporation, product name: MEGAFAC [registered trademark] R-30, composed of a fluorine-based surfactant) were added. The resultant mixture was dissolved in 6.7 g of propylene glycol monomethyl ether and 15.6 g of propylene glycol monomethyl ether acetate to obtain a solution. Subsequently, the solution was filtered using a polyethylene microfilter with a pore diameter of 0.2 μm to prepare a solution of the organic underlayer film forming composition for use in a lithography process with a multilayer film.

Comparative Example 1

To 1.0 g of a commercially available phenol novolac resin (manufactured by Gunei Chemical Industry Co., Ltd.), 0.2 g of tetramethoxymethyiglycoluril, 0.02 g of pyridinium-p-toluenesulfonate, and 0.003 g of a surfactant (manufactured by DIC Corporation, product name: MEGAFAC [trade name] R-30, composed of a fluorine-based surfactant) were added. The mixture was dissolved in 4.5 g of propylene glycol monomethyl ether acetate and 10.6 g of propylene glycol monomethyl ether to obtain a solution. Subsequently, the solution was filtered using a polyethylene microfilter with a pore diameter of 0.2 μm to prepare a solution of the organic underlayer film forming composition for use in a lithography process with a multilayer film.

Comparative Example 2

To 1 g of the resin obtained in Comparative Synthesis Example 1, 0.15 g of tetramethoxymethyiglycoluril and 0.015 g of pyridinium-p-toluenesulfonate were added. The mixture was dissolved in 18.0 g of propylene glycol monomethyl ether acetate and 4.5 g of propylene glycol monomethyl ether to obtain a solution. Subsequently, the solution was filtered using a polyethylene microfilter with a pore diameter of 0.2 μm to prepare a solution of the organic underlayer film forming composition for use in a lithography process with a multilayer film.

(Measurement of Optical Parameters)

The solutions of the organic underlayer film forming composition prepared in Examples 1 to 6 and Comparative Examples 1 and 2 were each applied on a silicon wafer using a spin coater. The applied solutions were baked on a hot plate at 240° C. for one minute to form organic underlayer film layers (film thickness of 0.05 μm). The refractive index (n value) at a wavelength of 193 nm and the optical absorption coefficient (k value, also called attenuation coefficient) of the organic underlayer film layers were measured using a spectroscopic ellipsometer. The results are shown in Table 1.

TABLE 1

Refractive Index n and Optical Absorption Coefficient k

|  |  | n (193 nm) | k (193 nm) |
|---|---|---|---|
| Example 1 | Film after 240° C. baking | 1.60 | 0.39 |
| Example 2 | Film after 240° C. baking | 1.27 | 0.18 |
| Example 3 | Film after 240° C. baking | 1.34 | 0.27 |
| Example 4 | Film after 240° C. baking | 1.42 | 0.25 |
| Example 5 | Film after 240° C. baking | 1.46 | 0.62 |
| Example 6 | Film after 240° C. baking | 1.37 | 0.73 |
| Comparative Example 1 | Film after 240° C. baking | 1.36 | 0.72 |
| Comparative Example 2 | Film after 240° C. baking | 1.38 | 0.38 |

(Elution Test into Photoresist Solvent)

The solutions of the organic underlayer film forming composition prepared in Examples 1 to 6 and Comparative Examples 1 and 2 were each applied on a silicon wafer using a spin coater. The applied solutions were baked on a hot plate at 210° C. for one minute to form organic underlayer film layers (film thickness of 0.20 μm). These organic underlayer film layers underwent an immersion test in a solvent used for the resist, for example, propylene glycol monomethyl ether and propylene glycol monomethyl ether acetate. The results are shown in Table 2. The residual film ratio was obtained by immersing the film layer in each solvent for 60 seconds, measuring the film thicknesses before and after immersion, and calculating (film thickness after immersion)/(film thickness before immersion)×100.

TABLE 2

Residual Film Ratio (%) After Elusion Test

|  |  | PGME | PGMEA |
|---|---|---|---|
| Example 1 | Film after 240° C. baking | 100% | 100% |
| Example 2 | Film after 240° C. baking | 99% | 100% |
| Example 3 | Film after 240° C. baking | 100% | 99% |
| Example 4 | Film after 240° C. baking | 100% | 100% |
| Example 5 | Film after 240° C. baking | 100% | 100% |
| Example 6 | Film after 240° C. baking | 100% | 100% |
| Comparative Example 1 | Film after 240° C. baking | 100% | 100% |
| Comparative Example 2 | Film after 240° C. baking | 100% | 100% |

(Measurement of Dry Etching Rate)

The etcher and the etching gas below were used for measurement of the dry etching rate.

RIE-10NR (manufactured by SAMCO INC.): $CF_4$

The solutions of the organic underlayer film forming composition prepared in Examples 1 to 6 and Comparative Examples 1 and 2 were each applied on a silicon wafer using a spin coater. The applied solutions were baked on a hot plate at 240° C. for one minute to form organic underlayer film layers (film thickness of 0.20 μm). Using $CF_4$ gas as etching gas, the dry etching rate was measured.

A solution of a cresol novolac resin (commercially available product, weight average molecular weight of 4000) was applied on a silicon wafer using a spin coater and baked at 205° C. for one minute to form an organic underlayer film layer (film thickness of 0.20 μm). Using $CF_4$ gas as etching gas, the dry etching rate was measured in the same manner as in Examples 1 to 6 and Comparative Examples 1 and 2 and compared with the dry etching rates of the organic underlayer film layers in Examples 1 to 6 and Comparative Examples 1 and 2. The results are shown in Table 3. The rate ratio (1) is the dry etching rate ratio of (the organic underlayer film layer used in Example)/(the cresol novolac resin film baked at 205° C. for one minute).

TABLE 3

Dry Etching Rate Ratio

| Example 1 | Rate ratio (1) of film after 240° C. baking | 1.25 |
|---|---|---|
| Example 2 | Rate ratio (1) of film after 240° C. baking | 0.83 |
| Example 3 | Rate ratio (1) of film after 240° C. baking | 0.87 |
| Example 4 | Rate ratio (1) of film after 240° C. baking | 0.96 |
| Example 5 | Rate ratio (1) of film after 240° C. baking | 0.83 |
| Example 6 | Rate ratio (1) of film after 240° C. baking | 0.90 |
| Comparative Example 1 | Rate ratio (1) of film after 240° C. baking | 0.94 |
| Comparative Example 2 | Rate ratio (1) of film after 240° C. baking | 0.75 |

(Resist Patterning Evaluation)

The organic underlayer film (layer A) forming compositions obtained in Examples 1 to 6 and Comparative Examples 1 and 2 were each applied on a silicon wafer and heated on a hot plate at 240° C. for one minute, resulting in an organic underlayer film (layer A) having a film thickness of 150 nm. An Si-containing resist underlayer film (layer B) forming composition was applied thereon and heated on a hot plate at 240° C. for one minute, resulting in an Si-containing resist underlayer film (layer B) having a film thickness of 35 nm.

On the Si-containing resist underlayer film, a photoresist solution (manufactured by FUJIFILM Corporation, trade name: FAiRS-9521NT05) was applied with a spinner and heated on a hot plate at 100° C. for one minute to form a photoresist film (layer C) having a film thickness of 85 nm. The resist was patterned using a NSR-S307E scanner manufactured by Nikon Corporation (wavelength of 193 nm, NA, a: 0.85, 0.93/0.85). The target was exposed through a mask set so as to form a line-and-space (dense lines) in which the line width and the width between lines of the photoresist were 0.06 μm after development. Subsequently, the target was baked on a hot plate at 100° C. for 60 seconds, then cooled and developed using butyl acetate (solvent developer) for 60 seconds, resulting in a negative pattern.

After the application of the Si-containing resist underlayer film, evaluation was performed for the case without being left, the case being left standing for one day before application of the resist, and the case subjected to HMDS processing before application of the resist. The HMDS processing was performed under the conditions of 150° C. for 60 seconds.

The results are shown in Table 4. The products without large pattern separation or poor resolution were determined to be good.

TABLE 4

Solvent Development Lithography Evaluation Result

| | Not left after application of Si-containing resist underlayer film | Left one day after application of Si-containing resist underlayer film | HMDS processing after application of Si-containing resist underlayer film |
|---|---|---|---|
| Example 1 | Good | Good | Good |
| Example 2 | Good | Good | Good |
| Example 3 | Good | Good | Good |
| Example 4 | Good | Good | Good |
| Example 5 | Good | Good | Good |
| Example 6 | Good | Good | Good |
| Comparative Example 1 | Good | No good | No good |
| Comparative Example 2 | Good | No good | No good |

The same process as described above was performed using the organic underlayer film forming compositions in Examples 1 and 2 except that the photoresist was developed after exposure using an alkaline developer (the developer was an aqueous solution of 2.38% tetramethylammonium hydroxide).

The results are shown in Table 5. The products without large pattern separation or poor resolution were determined to be good. The products with large pattern separation or poor resolution were determined to be no good,

TABLE 5

Solvent Development Lithography and Alkaline Development Lithography Evaluation Result

| | |
|---|---|
| Example 1 (solvent development lithography) | Good |
| Example 2 (solvent development lithography) | Good |
| Example 1 (alkaline development lithography) | No good |
| Example 2 (alkaline development lithography) | No good |

INDUSTRIAL APPLICABILITY

The organic underlayer film material used for the undermost layer in a lithography process with a multilayer film according to the present invention can form a good pattern without deteriorating the resolution limit even when being left after application of the Si-containing resist underlayer film in the solvent development process.

The invention claimed is:

1. A method of manufacturing a semiconductor device, comprising:
    forming an organic underlayer film on a semiconductor substrate;
    forming an inorganic hard mask on the organic underlayer film;
    forming a resist film on the inorganic hard mask;
    performing irradiation of light or an electron beam and solvent development to form a resist pattern;
    etching the inorganic hard mask using the resist pattern;
    etching the organic underlayer film using the patterned inorganic hard mask; and
    processing the semiconductor substrate using the patterned organic underlayer film, wherein
    the organic underlayer film is an organic underlayer film obtained by applying and heating an organic underlayer film forming composition containing a compound including an organic group having a functional group selected from the group consisting of an epoxy group, an isocyanate group, a blocked isocyanate group, and a benzocyclobutene ring group, and an organic solvent, wherein
    (1) the compound in the organic underlayer film forming composition is a polymer including a unit structure including an organic group (A1) having a functional group selected from the group consisting of an epoxy group, an isocyanate group, and a blocked isocyanate group, and a unit structure including an organic group (B1) having a functional group selected from the group consisting of a hydroxy group, a carboxylic acid group, a blocked carboxylic acid group, an amino group, an amido group, an isocyanuric acid group, and a thiol group, or
    (2) the compound in the organic underlayer film forming composition is a mixture comprising a polymer including a unit structure including an organic group (A1) having a functional group selected from the group consisting of an epoxy group, an isocyanate group, and a blocked isocyanate group, and a cross-linking compound including an organic group (B1) having a functional group selected from the group consisting of a hydroxy group, a carboxylic acid group, a blocked carboxylic acid group, an amino group, an amido group, an isocyanuric acid group, and a thiol group.

2. The method of manufacturing a semiconductor device according to claim 1, wherein (1) applies.

3. The method of manufacturing a semiconductor device according to claim 1, wherein (2) applies.

4. A method of manufacturing a semiconductor device, comprising:
    forming an organic underlayer film on a semiconductor substrate;
    forming an inorganic hard mask on the organic underlayer film;
    forming a resist film on the inorganic hard mask;
    performing irradiation of light or an electron beam and solvent development to form a resist pattern;
    etching the inorganic hard mask using the resist pattern;
    etching the organic underlayer film using the patterned inorganic hard mask; and
    processing the semiconductor substrate using the patterned organic underlayer film, wherein
    the organic underlayer film is an organic underlayer film obtained by applying and heating an organic underlayer film forming composition containing a compound including an organic group having a functional group selected from the group consisting of an epoxy group, an isocyanate group, a blocked isocyanate group, and a benzocyclobutene ring group, and an organic solvent, wherein
    the compound in the organic underlayer film forming composition is a mixture comprising a cross-linking compound including an organic group (A1) having a functional group selected from the group consisting of an epoxy group, an isocyanate group, and a blocked isocyanate group, and a polymer including a unit structure including an organic group (B1) having a functional group selected from the group consisting of a hydroxy group, a carboxylic acid group, a blocked carboxylic acid group, an amino group, an amido group, an isocyanuric acid group, and a thiol group.

5. The method of manufacturing a semiconductor device according to claim 2, wherein
    the compound in the organic underlayer film forming composition is a polymer including a unit structure including an organic group (A2) having an epoxy group or a blocked isocyanate group and a unit structure including an organic group (B2) having a hydroxy group, a blocked carboxylic acid group, or an amino group.

6. The method of manufacturing a semiconductor device according to claim 4, wherein
the compound in the organic underlayer film forming composition is a mixture comprising a cross-linking compound including an organic group (A3) having an epoxy group or an isocyanate group, and a polymer including a unit structure including an organic group (B3) having a hydroxy group.

7. The method of manufacturing a semiconductor device according to claim 2, wherein
the organic group (B1), is blended in an amount of 0.05 mol to 2 mol with respect to 1 mol of the organic group (A1).

8. The method of manufacturing a semiconductor device according to claim 3, wherein
the organic group (B1) is blended in an amount of 0.05 mol to 2 mol with respect to 1 mol of the organic group (A1).

9. The method of manufacturing a semiconductor device according to claim 4, wherein
the organic group (B1) is blended in an amount of 0.05 mol to 2 mol with respect to 1 mol of the organic group (A1).

10. The method of manufacturing a semiconductor device according to claim 5, wherein
the organic group (B2) is blended in an amount of 0.05 mol to 2 mol with respect to 1 mol of the organic group (A2).

11. The method of manufacturing a semiconductor device according to claim 6, wherein
the organic group (B3) is blended in an amount of 0.05 mol to 2 mol with respect to 1 mol of the organic group (A3).

12. The method of manufacturing a semiconductor device according to claim 2, wherein
the compound in the organic underlayer film forming composition is a polymer including a unit structure including an organic group (A1) having a functional group selected from the group consisting of an epoxy group, an isocyanate group, and a blocked isocyanate group, and a unit structure including an organic group (B1) having a functional group selected from the group consisting of a hydroxy group, a carboxylic acid group, an amino group, an amido group, an isocyanuric acid group, and a thiol group.

\* \* \* \* \*